(12) United States Patent
Liu et al.

(10) Patent No.: US 9,502,240 B2
(45) Date of Patent: Nov. 22, 2016

(54) PREPARATION METHOD OF CRYSTALLINE SILICON FILM BASED ON LAYER TRANSFER

(71) Applicant: SHANGHAI ADVANCED RESEARCH INSTITUTE, CHINESE ACADEMY OF SCIENCES, Shanghai (CN)

(72) Inventors: Dongfang Liu, Shanghai (CN); Wei Zhang, Shanghai (CN); Xiaoyuan Chen, Shanghai (CN); Hui Yang, Shanghai (CN); Cong Wang, Shanghai (CN); Linfeng Lu, Shanghai (CN)

(73) Assignee: SHANGHAI ADVANCED RESEARCH INSTITUTE, CHINESE ACADEMY OF SCIENCES, Shanghai (CN)

( * ) Notice: Subject to any disclaimer, the term of this patent is extended or adjusted under 35 U.S.C. 154(b) by 0 days.

(21) Appl. No.: 14/890,081

(22) PCT Filed: May 7, 2014

(86) PCT No.: PCT/CN2014/076930
§ 371 (c)(1),
(2) Date: Nov. 9, 2015

(87) PCT Pub. No.: WO2014/180310
PCT Pub. Date: Nov. 13, 2014

(65) Prior Publication Data
US 2016/0104615 A1  Apr. 14, 2016

(30) Foreign Application Priority Data
May 8, 2013  (CN) .......................... 2013 1 0167373

(51) Int. Cl.
*H01L 21/44* (2006.01)
*H01L 21/02* (2006.01)
(Continued)

(52) U.S. Cl.
CPC ..... *H01L 21/02532* (2013.01); *H01L 21/0262* (2013.01); *H01L 21/0265* (2013.01);
(Continued)

(58) Field of Classification Search
CPC .................. H01L 21/0262; H01L 21/02332; H01L 21/67069; H01L 21/67075; H01L 21/02252; H01L 21/02219; H01L 21/02046; H01L 21/02049; H01L 21/0228; H01L 21/02123; H01L 21/467; H01L 21/02208
USPC ........... 438/96, 97, 357, 680, 706, 745, 653, 438/723, 724, 756, 757, 787, 791; 257/E21.006, E21.007, E21.027, 257/E21.077, E21.126, E21.127, E21.17, 257/E21.267, E21.278, E21.293, E21.229, 257/E21.32
See application file for complete search history.

(56) References Cited

U.S. PATENT DOCUMENTS 6,143,629 A * 11/2000 Sato .................. H01L 21/76262
438/455
6,294,478 B1 * 9/2001 Sakaguchi ........ H01L 21/76259
438/753

(Continued)

FOREIGN PATENT DOCUMENTS

CN     1708844 A    12/2005
CN     1918697 A    2/2007
CN   102117869 A    7/2011

*Primary Examiner* — David Nhu
(74) *Attorney, Agent, or Firm* — Novick, Kim & Lee, LLC; Allen Xue (57) ABSTRACT

Provided is a preparation method of a crystalline silicon film. The method includes: 1) forming a mask for making a periodic silicon rod array on a monocrystalline silicon wafer substrate, and forming the periodic silicon rod array on the monocrystalline silicon substrate by a wet chemical etching or dry etching process; 2) forming barrier layers both on the surface of the monocrystalline silicon substrate and the surface of the silicon rod array for next selectively epitaxial growth of silicon; 3) exposing silicon cores on the heads of the rod array by a selective etching process to form a protruded silicon seeds out of the mother wafer substrate; 4) growing a continuous silicon film at the top of the rod array by a selective epitaxial chemical vapor deposition method using the exposed silicon cores as protruded seeds while leaving voids between the film and the mother wafer substrate; and 5) lifting off the silicon film and transferring the silicon film to a preset substrate, and the seeded substrate is reusable.

17 Claims, 5 Drawing Sheets

(51) Int. Cl.
  *H01L 21/306*    (2006.01)
  *H01L 21/3065*   (2006.01)
  *H01L 31/18*     (2006.01)

(52) U.S. Cl.
  CPC ... *H01L21/02381* (2013.01); *H01L 21/02639* (2013.01); *H01L 21/02658* (2013.01); *H01L 21/3065* (2013.01); *H01L 21/30604* (2013.01); *H01L 31/1804* (2013.01); *H01L 31/1896* (2013.01)

(56) References Cited

U.S. PATENT DOCUMENTS

| | | | |
|---|---|---|---|
| 7,498,265 B2* | 3/2009 | Wells | H01L 21/02381 438/700 |
| 7,906,830 B2* | 3/2011 | Wells | H01L 21/02381 257/521 |
| 8,445,387 B2* | 5/2013 | Wells | H01L 21/02381 438/700 |
| 2004/0115900 A1 | 6/2004 | Huang et al. | |
| 2008/0017100 A1 | 1/2008 | Chyi et al. | |

\* cited by examiner

PREPARATION METHOD OF CRYSTALLINE SILICON FILM BASED ON LAYER TRANSFER

CROSS-REFERENCE TO RELATED APPLICATIONS

This application is a national entry 35 U.S.C. §371 of PCT/CN2014/076930, filed May 7, 2014, which claims priority to CN 20131016737.3, filed May 8, 2013. The content of the above applications are hereby incorporated by reference in their entirety.

BACKGROUND OF THE PRESENT INVENTION

Field of Invention

The present invention belongs to the field of semiconductor materials, and in particular relates to a preparation method of transferrable mono-crystalline silicon films.

Description of Related Arts

Abundant, renewable and clean solar energy is a very important option for the global new energy strategy. To date, crystalline silicon solar cells account for more than 85% of market shares in the photovoltaic industry because of the highly mature silicon semiconductor technology, rich silicon resource, and their certified high photovoltaic energy conversion efficiency. The root cause of high energy conversion efficiency of crystal silicon cells is their high crystal quality which makes sure long minority carrier lifetime and long minority carrier diffusion length. However, the fabrication of monocrystalline silicon wafers is a high-energy-consumption and high material Kerf loss process, and this rather prohibits low-cost photovoltaic power. Therein, using silicon-containing gas to directly epitaxially grow transferrable monocrystal silicon films becomes a hot and promising solution for low-cost and high efficient photovoltaic technology.

After searching the prior arts, it is found that Tayanaka in Japan and Brendel in Germany successively and independently put forward a layer transfer technology using porous silicon to epitaxially grow monocrystal silicon film, respectively in 1996 and 1997. The specific process is that: a monocrystal silicon wafer is used as a substrate and a porous silicon structure with different porosities is formed on the surface through anode electrochemical etching; the porous structure is reconstructed through high-temperature annealing, the upper surface pores with a smaller porosity are closed, and restored to monocrystalline structures which can be used for epitaxial growth of a silicon film with high crystal quality, while the lower layer pores with a larger porosity are expanded to dozens of micrometers, letting the upper monocrystal epitaxial layer maintain a weak mechanical connection with the mother substrate, and can be used as a sacrificial layer for subsequently lifting off the epitaxial monocrystalline silicon film. By this method, Tayanaka team obtained a cell device with conversion efficiency of 12.5% in 1998. However, thereafter this technology was improved very slowly. Up to 2009, Reuter, et al upgraded the cell energy efficiency to 17% for 50 μm thick film, 2 cm² cell area via oxidizing and passivating the surface of the film at high temperature, and fabricating local contact electrodes by photolithography. In 2011, the Institute for Solar Energy Research Hamelin (ISFH) improved the efficiency to 19.1% (43 μm thick film) by passivating the film surface using $AlO_x$. In October, 2012, the layer transfer technology using porous silicon got its milestone, Solexel Inc. declared a world record 20.6% efficiency 156 mm×156 mm module using 43 μm thick film on the PV Asia Pacific Conference held in Singapore.

The development of the layer transfer technology using porous silicon is comparatively slow mainly due to the following difficulties that: (1) the quality of the grown film depends on the quality of the porous silicon layer, it is difficult to get uniform pores on a large area with stable mechanical and thermal properties; (2) for films, it is difficult to prepare a high quality texturized front and back side surface structures for light trapping; (3) the porous layer is easily cracked due to thermal or mechanical stresses, resulting in the obtained film with low tolerance for cell processing, such as wet-chemical etching, wet clean and spinning dry, sputtering deposition, etc.; and (4) the higher specific surface ratio of thinner silicon requires higher quality of surface and interface passivation for maintaining high efficiency of cell devices.

SUMMARY OF THE PRESENT INVENTION

To overcome the above-mentioned difficulties in the prior art, the present invention provides a new preparation method of crystalline silicon films based on layer transfer. This method also takes into account both assets: high crystal quality of monocrystal film, and low cost of chemical vapor deposition. In this method, a periodically patterned silicon rod array is prepared by micro/nanofabrication technique using monocrystal silicon wafers as mother substrates; then a $SiO_2/Si_3N_4$ layer is formed both on the surface of rods and that of the mother substrate, using as a barrier layer for later selective film growth; the $SiO_2/Si_3N_4$ shell on the rod head is selectively etched off to expose the inner silicon core; subsequently, selective epitaxial growth is performed in a chemical vapor deposition system by using the exposed silicon core head as protruded seeds or nucleation positions; as the growth evolved, the seeds grow larger and merge into a continuous film leaving voids between the substrate and the grown film, and the voids will facilitate the film later to be transferred; when the film gets the desired thickness, the film is lifted off, and the substrate with protruded seeds is reused for next film growth round. Thereby, the grown film can inherit the crystal quality of the mother substrate and thus the film is guaranteed to have long minority carrier lifetime and long minority carrier diffusion length, i.e., material quality for high energy conversion efficiency solar-cells. At the same time, the substrate with protruded seeds can be repetitively used, offering a low-cost film growth route.

In order to realize the above-mentioned purposes and other related purposes, the present invention provides a preparation method of a crystalline silicon film based on layer transfer, which at least comprises the following steps:

1) providing a patterned mask on a monocrystal silicon wafer for making a periodic silicon rod array on the wafer substrate, and fabricating the rod array on the substrate by a wet chemical etch or dry etch process;

2) forming barrier layers on the wafer substrate surface and the rod surface for selective silicon epitaxial growth;

3) removing the barrier layers on the heads of the rods by a selective etch process, and exposing the inner silicon core on the head of the rod to form a protruded silicon seeds;

4) growing a continuous silicon film at the top of the rod array by a chemical vapor deposition method using the exposed silicon cores as protruded seeds for selective epitaxial growth; and 5) lifting off the grown silicon film and transferring the film to a preset substrate, and the left substrate with the protruded seeds is reused for next film growth round.

As a preferred solution of the preparation method of the crystalline silicon film based on layer transfer provided by the present invention, in step 1), the mask for making the periodic silicon rod array is formed by a photolithography process.

As a preferred solution of the preparation method of the crystalline silicon film based on layer transfer provided by the present invention, the wet chemical etch in step 1) is performed by using gold or silver as catalyst, and mixed solution of HF and $H_2O_2$ as etching solution.

As a preferred solution of the preparation method of the crystalline silicon film based on layer transfer provided by the present invention, the dry etching process in step 1) is an inductively coupled plasma etching process.

As a preferred solution of the preparation method of the crystalline silicon film based on layer transfer provided by the present invention, the barrier layers are $SiO_2$ layers or $Si_3N_4$ layers.

As a preferred solution of the preparation method of the crystalline silicon film based on layer transfer provided by the present invention, step 3) comprises the following steps:

3-1) filling photoresist in the space of the silicon rod array and exposing the barrier layers on the head of the rod;

3-2) removing the barrier layers on the heads of the rods by plasma etching, and exposing the silicon cores on the head of the rods; and 3-3) removing the photoresist.

As a preferred solution of the preparation method of the crystalline silicon film based on layer transfer provided by the present invention, in step 4), the continuous silicon film is formed on the substrate at 900-1100° C. by using trichlorosilane as a silicon source and $H_2$ as reducing gas.

As a preferred solution of the preparation method of the crystalline silicon film based on layer transfer provided by the present invention, in step 5), the silicon film is lifted off by selectively etching in KOH solution or mechanical stripping.

As a preferred solution of the preparation method of the crystalline silicon film based on layer transfer provided by the present invention, the preparation method further comprises the step of performing cleaning and reducing treatment to the rod array for repetitive use after the silicon film is transferred.

As described above, the present invention provides a preparation method of a crystalline silicon film based on layer transfer, which at least comprises the following steps: 1) providing a monocrystalline silicon wafer substrate, forming a mask for making a periodic silicon rod array on the monocrystalline silicon substrate, and forming the periodic silicon rod array on the monocrystalline silicon substrate by a wet chemical etching or dry etching process; 2) forming barrier layers on the surface of the monocrystalline silicon substrate and the surface of the silicon rods for selective epitaxial growth of silicon; 3) removing the barrier layers on the heads of the rods by a selective etching process, and exposing the silicon cores on the heads of the rods to form a protruded silicon seed array; 4) growing a continuous silicon film at the top of the rod array by a chemical vapor deposition method using the exposed silicon core head as protruded seeds for epitaxial silicon growth; and 5) lifting off the silicon film and transferring the silicon film to a preset substrate, and the substrate with protruded seeds is reusable.

Since the present invention uses a monocrystalline silicon wafer as a mother substrate, the grown silicon film can inherit the crystal quality of the mother substrate and thereby the crystal quality of the film can ensure a high energy conversion efficiency solarcells. After the silicon film is lifted off, the substrate can be repetitively used after simple treatment, on the other hand, the silicon film growth by the chemical vapor deposition is simple and low-cost, thereby the silicon film can be obtained in low cost. In addition, the thermal and mechanical properties of the seeded substrate are stable, so the film staying with the mother substrate is highly process-tolerant, such as surface texturization, surface passivation, sputtering deposition, wet cleaning, drying, lithography, and so on, will be much conveniently performed and bring few film cracks, this character is indispensable for industrial cell manufacturing with high yield. Besides, a texturized surface structure can be in situ formed on the surface of the film by controlling the seed orientation and arrangement, film growth temperature and gas source conditions using anisotropic crystallographic growth nature, and the cell junction can be formed in situ through film growth instead of a subsequent $POCl_3$ diffusion process, therefore the cell manufacturing process is simplified. The texturized surface structure on the stripping side can also be used as a cell backside light reflecting structure to increase the length of a light path and improve the efficiency of the cell. Because the space between the grown film and the mother substrate is hollow with air, the passivation of cell backside can also be done by oxidization at high temperature when the film still staying with the substrate, especially for the cell style with local diffused back electrode. Then, after the film is lifted off and transferred, only backside antireflection coating, backside electrode processing (both are low temperature processes) are not yet done for traditional PERL (passivated emitter rear locally diffused) cells, which is much beneficial for the realization of a flexible cell on polymer substrates.

DESCRIPTION OF COMPONENT MARK NUMBERS

| | |
|---|---|
| 101 | Monocrystalline substrate |
| 102 | Mask |
| 103 | Silicon rod array |
| 104 | Barrier layer |

| 105 | Photoresist |
| --- | --- |
| 106 | Silicon film |

DETAILED DESCRIPTION OF THE PREFERRED EMBODIMENTS

The embodiments of the present invention will be described below through specific examples. One skilled in the art can easily understand other advantages and effects of the present invention according to the contents disclosed by the description. The present invention can also be implemented or applied through other different specific embodiments. All details in the description can also be based on different points of view and applications. Various modifications or variations can be made without departing from the spirit of the present invention.

Please refer to FIG. 1 to FIG. 10. It needs to be noted that the drawings provided in this embodiment are just used for exemplarily describing the basic concept of the present invention, thus the drawings only show components related to the present invention but are not drawn according to component numbers, shapes and sizes during actual implementation, the patterns, numbers and proportions of all components can be randomly changed during actual implementation, and the component layout patterns can also be more complex.

As shown in FIG. 1 to FIG. 10, the present invention provides a preparation method of a crystalline silicon film based on layer transfer, which at least comprises the following steps:

As shown in FIG. 1 to FIG. 4, firstly perform step 1) providing a monocrystalline silicon wafer substrate 101, forming a mask 102 for making a periodic silicon rod array 103 on the monocrystalline silicon substrate 101, and forming the periodic silicon rod array 103 on the monocrystalline silicon substrate 101 by a wet chemical etching or dry etching process.

As an example, the mask 102 for making the periodic silicon rod array 103 is formed by photolithography micro/nanofabrication process.

As an example, wet chemical etching is performed by using gold or silver as catalyst and mixed solution of HF and $H_2O_2$ as etching solution.

As an example, the dry etching process is an inductively coupled plasma etching process.

In this embodiment, by taking the wet chemical etching as an example, under the catalytic effect of the gold or silver, the corrosion speed on the interface with gold or silver is much higher than that on the interface without gold or silver, firstly a 30 nm-60 nm gold film is deposited on the surface of the monocrystalline silicon substrate 101 with a patterned mask on the surface through thermal evaporation, then the silicon wafer is put into a polytetrafluoroethylene container with the mixed solution of HF and $H_2O_2$; the silicon wafer is taken out after a duration of about 2 hours at room temperature; the silicon wafer is washed with a great amount of deionized water and finally the silicon wafer is blow-dried by nitrogen, wherein the height of the formed silicon rod array 103 is 10 μm.

Figure 1:
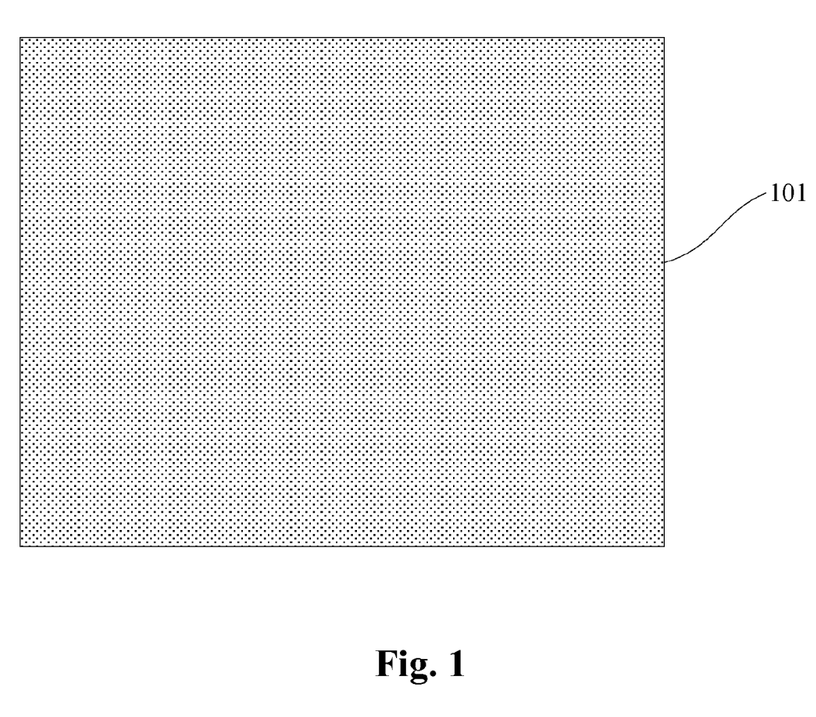
FIG. 1 to FIG. 4 illustrate schematic views presented in step 1) of the preparation method of the crystalline silicon film based on layer transfer provided by the present invention.
Figure 2:
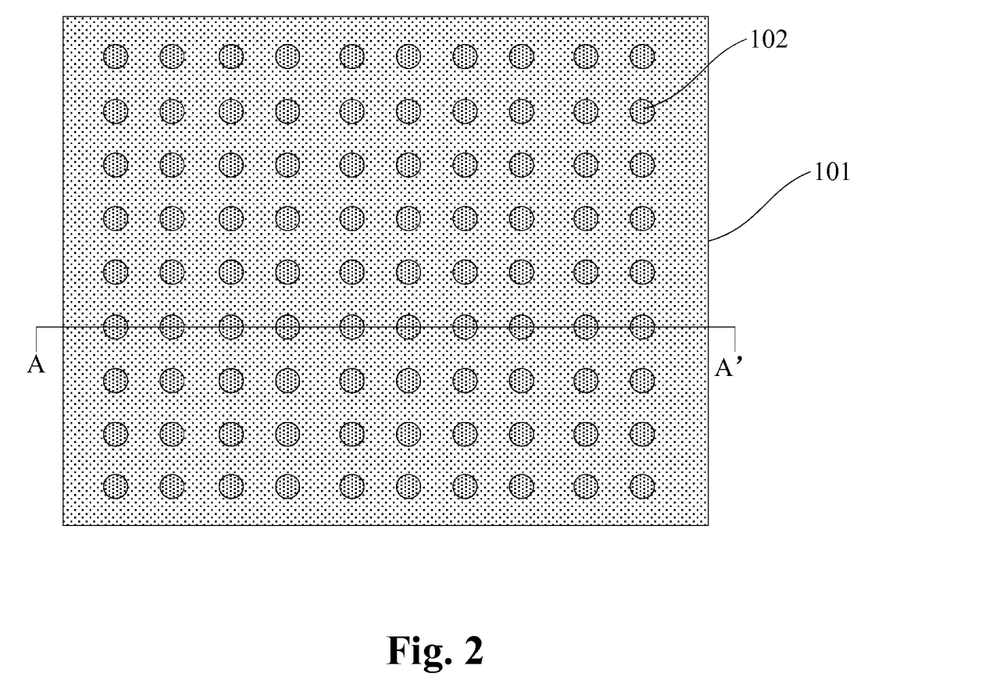
Figure 3:
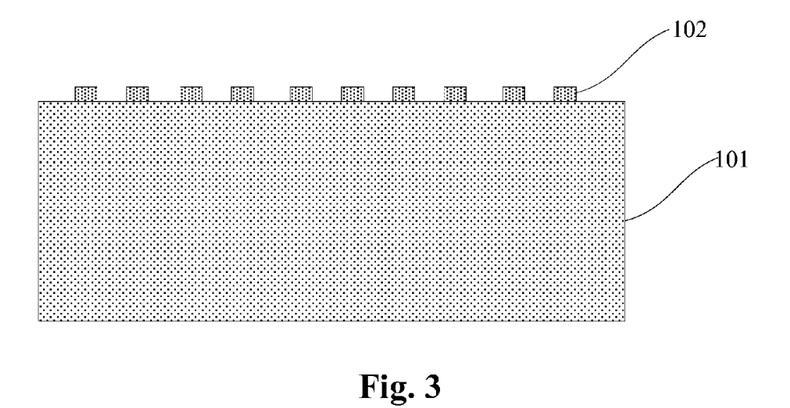
Figure 4:
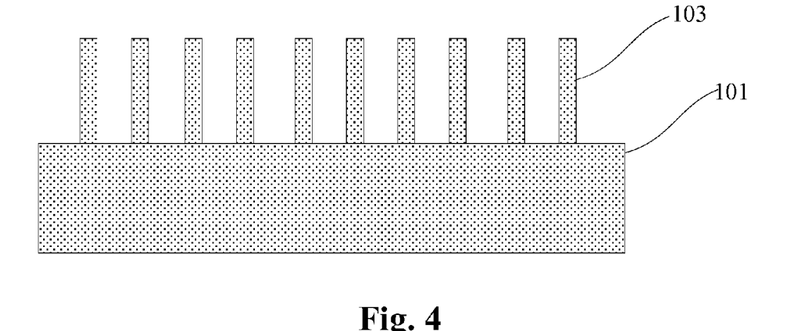
Figure 5:
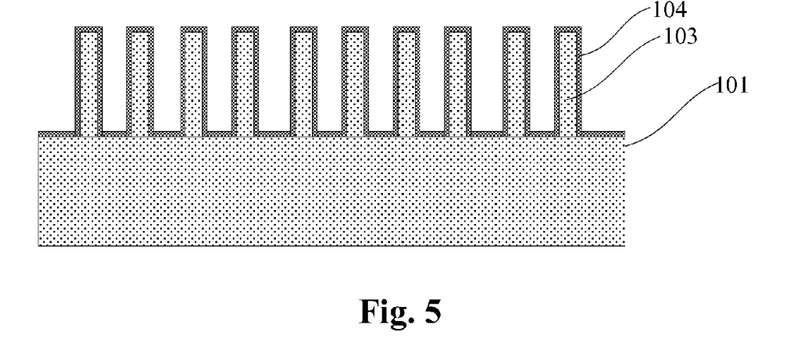
FIG. 5 illustrates a schematic view presented in step 2) of the preparation method of the crystalline silicon film based on layer transfer provided by the present invention.

As shown in FIG. 5, then perform step 2) forming barrier layers 104 on the surface of the monocrystalline silicon substrate 101 and the surface of the silicon rod array 103 for selectively silicon epitaxial growth.

As an example, the barrier layers 104 are $SiO_2$ layers or $Si_3N_4$ layers.

As an example, the $SiO_2$ shell layers are obtained by dry-oxygen thermal oxidization at 1100° C.

As an example, the $Si_3N_4$ shell layers are obtained through growth at 800-1000° C. by a low-pressure chemical vapor deposition method using trichlorosilane and ammonia gas respectively as a silicon source and a nitrogen source.

The formation of compact and uniform barrier layers 104 on the surfaces of the silicon wafer and the surfaces of the array rods is crucial to the subsequent selective silicon growth on the seeds. In this embodiment, preparation of $SiO_2$ is performed by a thermal oxidization process as an example, the substrate 101 with the silicon rod array 103 is placed in a tube furnace, pure $O_2$ is fed and held for 5 h at 1100° C., wherein the thickness of the obtained $SiO_2$ is about 300 mm.

Figure 6:
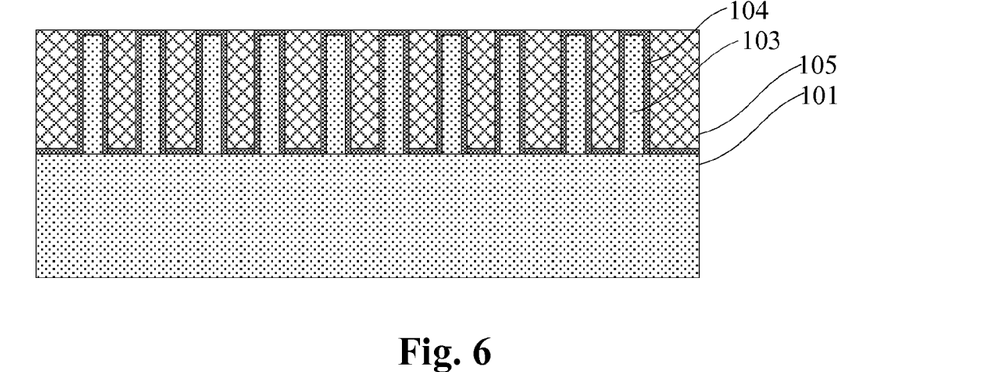
FIG. 6 to FIG. 8 illustrate schematic views presented in step 3) of the preparation method of the crystalline silicon film based on layer transfer provided by the present invention.
Figure 7:
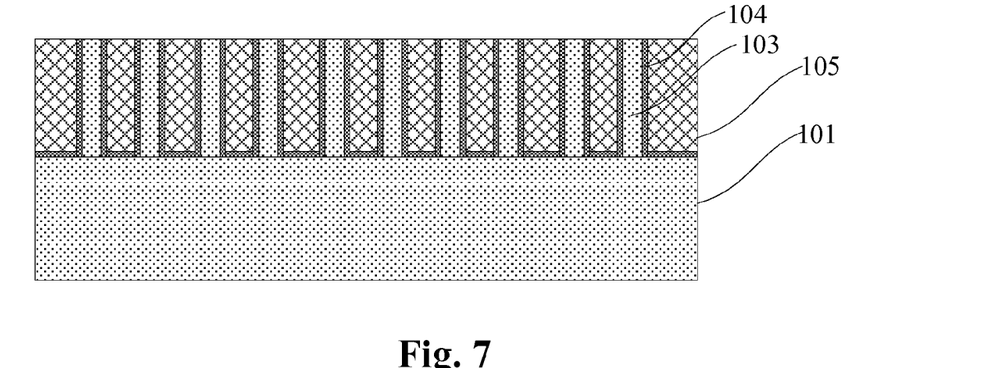
Figure 8:
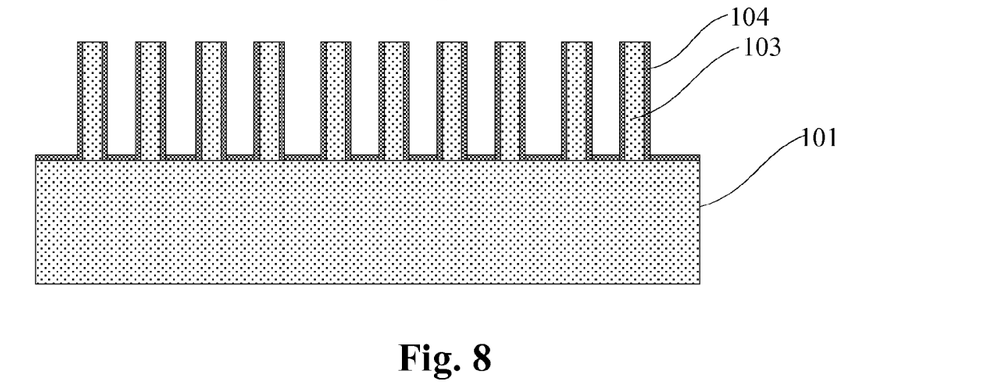

As shown in FIG. 6 to FIG. 8, then perform step 3) removing the barrier layers 104 on the heads of the rod array 103 by a selective etching process and exposing silicon cores on the heads of the rod array 103 to form a protruded silicon seed array.

As an example, step 3) comprises the following steps:

3-1) filling photoresist 105 in the hollow of the silicon rod array 103 and exposing the barrier layers 104 on the heads of the rod array 103, as shown in FIG. 6;

3-2) removing the barrier layers 104 on the head of the rod array 103 by plasma etching and exposing the silicon cores on the heads of the rod array 103 as shown in FIG. 7; and 3-3) removing the photoresist 105, as shown in FIG. 8.

Figure 9:
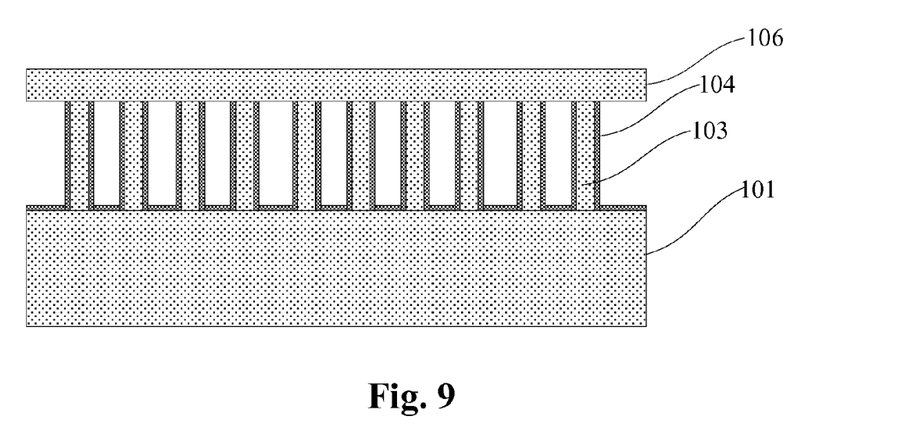
FIG. 9 illustrates a schematic view presented in step 4) of the preparation method of the crystalline silicon film based on layer transfer provided by the present invention.

As shown in FIG. 9, then perform step 4) growing a continuous silicon film 106 at the top of the rod array 103 by a chemical vapor deposition method using the exposed silicon cores as protruded seeds for selectively epitaxial growth.

As an example, the continuous silicon film 106 is formed on the substrate at 900-1100° C. by using trichlorosilane as a silicon source and $H_2$ as reductive gas.

The growth process of the silicon film 106 is controlled by such conditions as source gas concentration, gas pressure, substrate temperature, seed array patterning manner and orientation, and growth time. The complete seamless silicon film 106 can be obtained and the final thickness of the silicon film 106 is controlled to 10 μm-60 m.

Figure 10:
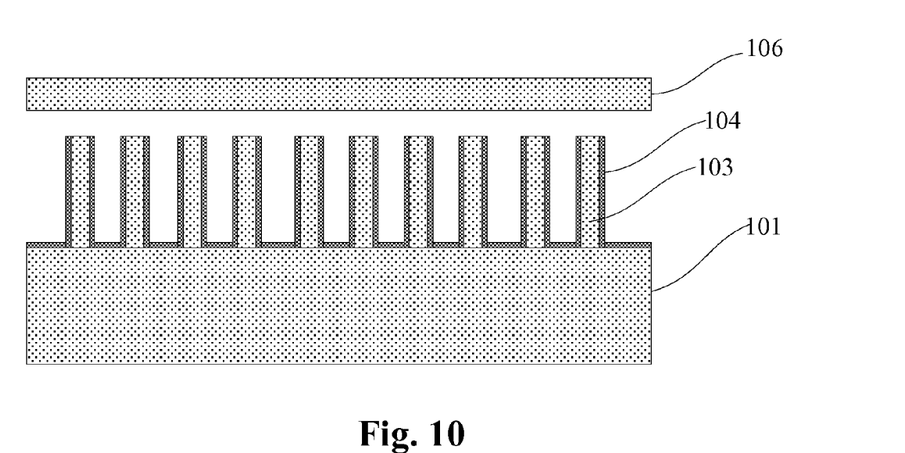
FIG. 10 illustrates a schematic view presented in step 5) of the preparation method of the crystalline silicon film based on layer transfer provided by the present invention.

As shown in FIG. 10, finally perform step 5) lifting off the silicon film 106 and transferring the silicon film 106 to a preset substrate.

As an example, the process of transferring the silicon film 106 is lifting off by the selective etching using KOH solution, and PMDS (polydimethylsiloxane) or PI (polyimide) is used as a flexible transfer substrate.

As an example, the preparation method of the crystalline silicon film based on layer transfer further comprises the step of performing cleaning and reducing treatment to the rod array 103 for repetitive use after the silicon film 106 is transferred. Since the exposed silicon core head of rod array 103 easily adsorbs a layer of foreign substances in air or is oxidized in air to form an oxidized layer with thickness of several nanometers, in this embodiment, the seeded mother substrate is cleaned after film transfer by using concentrated $H_2SO_4/H_2O_2$, washed with a great amount of deionized water and blow-dried by nitrogen, then the thin oxidized layer (with thickness of several nanometers) on the seed surface is reduced in a low-vacuum $H_2$ atmosphere, and thereby the seeded substrate is restored selective growth activity, then will be reused for next epitaxial growth.

To sum up, the present invention provides a preparation method of a crystalline silicon film based on layer transfer, which at least comprises the following steps: 1) providing a monocrystalline silicon wafer substrate 101, forming a mask 102 for making a periodic silicon rod array 103 on the monocrystalline silicon substrate 101, and forming the periodic silicon rod array 103 on the monocrystalline silicon substrate 101 by a wet chemical etching or dry etching process; 2) forming barrier layers 104 on the surface of the monocrystalline silicon substrate 101 and the surface of the silicon rod array 103 for selectively epitaxial growth of silicon; 3) removing the barrier layers on the heads of the silicon rod array 103 by a selective etching process and exposing silicon cores on the heads of the rods to form protruded silicon seeds; 4) growing a continuous silicon film 106 at the top of the rod array 103 by a chemical vapor deposition method using the exposed silicon cores as protruded seeds for selectively epitaxial growth of silicon; and 5) lifting off the silicon film 106 and transferring the silicon film 106 to a preset substrate.

Since the present invention uses a monocrystalline silicon wafer as a mother substrate, the grown silicon film can inherit the crystal quality of the mother substrate and thereby the crystal quality of the film can ensure a high energy conversion efficiency solarcells. After the silicon film is lifted off, the substrate can be repetitively used after simple treatment, on the other hand, the silicon film growth by the chemical vapor deposition is simple and low-cost, thereby the silicon film can be obtained in low cost. In addition, the thermal and mechanical properties of the seeded substrate are stable, so the film staying with the mother substrate is highly process-tolerant, such as surface texturization, surface passivation, sputtering deposition, wet cleaning, drying, lithography, and so on, will be much conveniently performed and bring few film cracks, this character is indispensable for industrial cell manufacturing with high yield. Besides, a texturized surface structure can be in situ formed on the surface of the film by controlling the seed orientation and arrangement, film growth temperature and gas source conditions using anisotropic crystallographic growth nature, and the cell junction can be formed in situ through film growth instead of a subsequent $POCl_3$ diffusion process, therefore the cell manufacturing process is simplified. The texturized surface structure on the stripping side can also be used as a cell backside light reflecting structure to increase the length of a light path and improve the efficiency of the cell. Because the space between the grown film and the mother substrate is hollow with air, the passivation of cell backside can also be done by oxidization at high temperature when the film staying with the substrate for the cell style with local diffused back electrode. Then, after the film is lifted off and transferred, only backside antireflection coating, backside electrode processing (both are low temperature processes) are not yet done for traditional PERL (passivated emitter rear locally diffused) cells, which is much beneficial for the realization of a flexible cell on polymer substrates. The above-mentioned embodiments are just used for exemplarily describing the principle and effect of the present invention instead of limiting the present invention. One skilled in the art can make modifications or variations to the above-mentioned embodiments without departing from the spirit and the range of the present invention. Therefore, all equivalent modifications or variations made by those who have common knowledge in the art without departing from the spirit and technical concept disclosed by the invention shall be still covered by the claims of the present invention.

What is claimed is:

1. A preparation method of a crystalline silicon film based on layer transfer, comprising:
    1) providing a mask on a monocrystalline silicon wafer substrate to make a periodic silicon rod array on the monocrystalline silicon substrate by a wet chemical etching process or a dry etching process;
    2) forming a barrier layer on the surface of the monocrystalline silicon substrate and the surface of the silicon rods for later performing selectively epitaxial silicon growth;
    3) removing the barrier layer on the heads of the rod array by a selective etching process and exposing the silicon cores on the heads of the rod array to form protruded silicon seeds;
    4) growing a continuous silicon film at the top of the rod array by a chemical vapor deposition method using the exposed silicon cores as protruded seeds for selectively epitaxial growth of silicon; and
    5) lifting off the silicon film and transferring the silicon film to a preset substrate.

2. The method of claim 1, wherein the rods are used to form protruded silicon seeds out of the mother wafer substrate; via a selective epitaxial growth, the protruded seeds grow larger and converge into a voidless film, leaving hollow space between the film and the mother substrate.

3. The method of claim 2, wherein the hollow space allows an etching solution to run into under the grown film, etch and non-destructively lift off the grown film.

4. The hollow space of claim 2 makes the grown film weak mechanically connected with the mother substrate only by the rods, which facilitates to mechanically peel off the grown film from the mother substrate.

5. The method of claim 1, wherein the periodically distributed rods provide uniform and stable mechanical support for the grown film to undergo later solar cell processing with a lower possibility of cracking.

6. The method of claim 1, wherein the protruded seeds come from a single mother monocrystal wafer, which ensures that all the seeds have absolutely same crystallographic orientation and monocrystal film can be epitaxially formed from these discretely distributed seeds.

7. The method of claim 2, wherein the hollow space provides a passageway for gas so that both sides of the grown film can be passivated by silicon oxide via dry oxygen thermal oxidization or by alumina via atomic layer deposition method while the grown film still stays on the mother wafer substrate; therefore, when the passivated film is lift off from the mother substrate, non-passivated opening is left on the site of the former rod; these pre-patterned openings by the rod pattern can be used as local diffusion sites for PERL or PERC solar cell designs with high efficiency nature.

8. The method of claim 1, wherein the periodicity of the rod array brings that of the protruded seed pattern, this periodicity will result into periodic down-pyramidal surface texturization on both sides of the grown film because of the anisotropic growth nature of the discretely distributed protruded seeds when using (100) oriented mother wafer as the substrate.

9. The method of claim 8, wherein the surface texturization feature is controlled by the rod diameter, the rod distance, the pattern symmetry, and the gas condition and temperature for the epitaxial chemical vapor deposition growth.

10. The preparation method of claim 1, wherein the mask is formed by photolithography micro/nanofabrication process.

11. The preparation method of claim 1, wherein the wet chemical etching in step 1) employs gold or silver as catalyst and an etching solution compromising HF and $H_2O_2$.

12. The preparation method of claim 1, wherein the dry etching process is an inductively coupled plasma etching process.

13. The preparation method of claim 1, wherein the barrier layer for selective epitaxial growth is a $SiO_2$ layer or a $Si_3N_4$ layer.

14. The preparation method of claim 1, wherein the step 3) further comprises
   3-1) filling photoresist into voids between the array of silicon rods and exposing the barrier layers of the heads of the silicon rod array;
   3-2) applying plasma etching to remove the barrier layers on the heads of the silicon rod array so that exposing the silicon cores on the head of the rods to form protruded seeds;
   3-3) removing the photoresist between rods.

15. The preparation method of claim 1, wherein the continuous silicon film is epitaxially grown on the substrate at 900-1100° C. by using trichlorosilane as a silicon source and hydrogen as reducing gas.

16. The preparation method of claim 1, wherein the silicon film is lifted off through selective etching in a KOH solution, or is mechanically peeled off by vacuum adsorption.

17. The preparation method of claim 1, wherein the mother substrate with protruded seeds is reused for next growth round when further comprising: cleaning and reducing the rod array after the grown film lifted off and transferred.

* * * * *